(12) United States Patent
Basceri et al.

(10) Patent No.: US 7,323,737 B2
(45) Date of Patent: Jan. 29, 2008

(54) DRAM CONSTRUCTIONS AND ELECTRONIC SYSTEMS

(75) Inventors: Cem Basceri, Reston, VA (US); F. Daniel Gealy, Kuna, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/517,209

(22) Filed: Sep. 6, 2006

(65) Prior Publication Data

US 2007/0026601 A1 Feb. 1, 2007

Related U.S. Application Data

(60) Continuation of application No. 10/704,284, filed on Nov. 6, 2003, now Pat. No. 7,129,535, which is a division of application No. 10/435,103, filed on May 9, 2003, now Pat. No. 6,812,110.

(51) Int. Cl.
*H01L 27/108* (2006.01)
*H01L 23/48* (2006.01)
*H01L 21/8234* (2006.01)

(52) U.S. Cl. .................. 257/296; 257/298; 257/301; 257/751; 438/238; 438/239; 438/386

(58) Field of Classification Search .............. 257/277, 257/296, 298, 300, 301, 751, 765, 771; 438/238, 438/239, 386, 243, 244, 387
See application file for complete search history.

(56) References Cited

U.S. PATENT DOCUMENTS

| | | | |
|---|---|---|---|
| 3,988,824 A | 11/1976 | Bodway | |
| 4,464,701 A | 8/1984 | Roberts et al. | |
| 4,733,328 A | 3/1988 | Blazej | |
| 5,508,881 A | 4/1996 | Stevens | |
| 5,509,558 A | 4/1996 | Imaie et al. | |
| 5,621,607 A | 4/1997 | Farahmandi et al. | |
| 5,741,721 A | 4/1998 | Stevens | |
| 5,777,428 A | 7/1998 | Farahmandi et al. | |
| 5,922,411 A | 7/1999 | Shimizu et al. | |
| 6,059,847 A | 5/2000 | Farahmandi et al. | |
| 6,077,774 A | 6/2000 | Hong et al. | |
| 6,107,136 A | 8/2000 | Melnick et al. | |

(Continued)

FOREIGN PATENT DOCUMENTS

EP 0 671 765 A1 9/1995

(Continued)

*Primary Examiner*—Hsien-Ming Lee
(74) *Attorney, Agent, or Firm*—Wells St. John P.S.

(57) ABSTRACT

The invention includes methods in which metal oxide dielectric materials are deposited over barrier layers. The barrier layers can comprise compositions of metal and one or more of carbon, boron and nitrogen, and the metal oxide of the dielectric material can comprise the same metal as the barrier layer. The dielectric material/barrier layer constructions can be incorporated into capacitors. The capacitors can be used in, for example, DRAM cells, which in turn can be used in electronic systems.

12 Claims, 5 Drawing Sheets

U.S. PATENT DOCUMENTS

| | | |
|---|---|---|
| 6,153,872 A | 11/2000 | Hagmann et al. |
| 6,340,827 B1 | 1/2002 | Choi et al. |
| 6,387,748 B1 | 5/2002 | Agarwal |
| 6,451,661 B1 | 9/2002 | DeBoer et al. |
| 6,461,914 B1 | 10/2002 | Roberts et al. |
| 6,476,454 B2 | 11/2002 | Suguro |
| 7,164,165 B2 * | 1/2007 | Basceri et al. ............... 257/295 |
| 2001/0039085 A1 | 11/2001 | Agarwal |
| 2001/0053576 A1 | 12/2001 | DeBoer et al. |
| 2002/0030191 A1 | 3/2002 | Das et al. |
| 2002/0079531 A1 | 6/2002 | Al-Shareef et al. |
| 2002/0115252 A1 | 8/2002 | Haukka et al. |
| 2002/0164852 A1 | 11/2002 | Forbes et al. |
| 2003/0060003 A1 | 3/2003 | Hecht et al. |
| 2003/0148627 A1 | 8/2003 | Aoki et al. |

FOREIGN PATENT DOCUMENTS

| | | |
|---|---|---|
| EP | 0 862 203 A1 | 9/1998 |
| EP | 1 035 564 A2 | 9/2000 |
| KR | 2002-0085979 | 11/2002 |
| WO | WO 02/031875 A2 | 4/2002 |
| WO | WO 02/031875 A3 | 4/2002 |
| WO | 2004/013963 | 5/2004 |

* cited by examiner

DRAM CONSTRUCTIONS AND ELECTRONIC SYSTEMS

RELATED PATENT DATA

This patent resulted from a continuation application of U.S. patent application Ser. No. 10/704,284, which was filed Nov. 6, 2003 now U.S. Pat. No. 7,129,535, is hereby incorporated by reference, and which resulted from a divisional application of U.S. patent application Ser. No. 10/435,103, which was filed May 9, 2003, issued as U.S. Pat. No. 6,812,110, and is hereby incorporated by reference.

TECHNICAL FIELD

The invention pertains to capacitor constructions and methods of forming capacitor constructions. The invention also pertains to methods of forming constructions comprising dielectric materials.

BACKGROUND OF THE INVENTION

There is a continuing interest to incorporate oxide dielectrics into semiconductor constructions. Among the dielectrics that are of particular interest are those represented by the formula $MO_z$, where M represents a metal, O is oxygen, and z is a number greater than 0, and typically less than or equal to 8. The metal can be a transition metal, such as, for example, hafnium, or a non-transition metal, such as, for example, aluminum. The dielectric materials can be useful in, for example, capacitor constructions.

A difficulty in utilizing metal oxide dielectrics ($MO_z$) is that diffusion can occur between the dielectric materials and structures proximate to the dielectric materials, and such diffusion can adversely affect properties of the dielectric material and/or the structures proximate to the dielectric material. For instance, if a conductive structure comprises conductively-doped silicon and $MO_z$ is formed directly on the conductively-doped silicon, oxygen from the $MO_z$ can interact with the silicon to oxidize the silicon. The oxidized silicon will no longer have the desired conductive properties of conductively-doped silicon.

The problems discussed above can be alleviated, and even prevented, through utilization of a metal nitride barrier layer. The metal nitride can be represented as $MN_y$, where M is metal, N is nitrogen, and y is a number greater than 0 and typically less than 8. The metal nitride is frequently referred to as a diffusion barrier layer, as the metal nitride alleviates, and frequently even prevents, diffusion to and/or from a metal oxide dielectric. U.S. Pat. No. 5,741,721 describes exemplary structures in which metal oxide dielectric materials are formed over metal nitride barrier layers. U.S. Pat. No. 5,741,721 specifically describes processes in which a metal nitride layer is formed over a semiconductor substrate, and subsequently a surface of the metal nitride layer is oxidized to form a metal oxide dielectric material.

The processing described in U.S. Pat. No. 5,741,721 can be difficult to incorporate into various semiconductor fabrication processes. Accordingly, it would be desirable to develop alternative methods for forming metal oxide dielectric material adjacent diffusion barrier layers.

SUMMARY OF THE INVENTION

In one aspect, the invention encompasses a method of forming a construction which includes a dielectric material. A layer comprising one or more of $MC_x$, $MB_q$ and $MN_y$ is formed, with M being a metal, and with q, x and y being numbers greater than 0. A dielectric material comprising $MO_z$ is deposited over and directly against the layer, with z being a number greater than 0. In particular aspects, the layer and the dielectric material can comprise a metal (for example, hafnium or aluminum) in common.

In one aspect, the invention pertains to a method of forming a capacitor construction. A first electrically conductive material is formed over a semiconductor substrate. An intermediate layer is formed over the first electrically conductive material. The intermediate layer predominantly comprises a composition of a metal and one or more of boron, nitrogen and carbon. A dielectric layer is deposited over and directly against the intermediate layer, with the dielectric layer predominantly comprising a composition of the metal and oxygen. A second electrically conductive material is formed over the dielectric layer. The second electrically conductive material is capacitively connected with the first electrically conductive material.

In one aspect, the invention encompasses a capacitor construction. The construction includes a first electrically conductive material, and a first intermediate layer over the first electrically conductive material. The first intermediate layer predominantly comprises a composition of aluminum and one or more of boron, nitrogen and carbon. A dielectric material is over and directly against the first intermediate layer. The dielectric material predominantly comprises a composition of aluminum and oxygen. A second intermediate layer is over the dielectric material, with the second intermediate layer predominantly comprising the composition of aluminum and one or more of boron, nitrogen and carbon. A second electrically conductive material is over the second intermediate layer. The second electrically conductive material is capacitively connected with the first electrically conductive material. The capacitor construction can be incorporated into a dynamic random access memory (DRAM) cell. The DRAM cell can be utilized in an electronic system.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention includes structures in which a layer comprising metal carbide, metal boride and/or metal nitride is provided proximate a metal oxide dielectric material. The metal carbide can be referred to as $MC_x$, where M is a metal, C is carbon, and x is a number greater than 0 and typically less than 8; the metal boride can be referred to as $MB_q$, where M is metal, B is boron, and q referred to as $MN_y$, where M is a metal, N is nitrogen, and y is a number greater than 0 and typically less than 8; and the metal oxide can be referred to as $MO_z$, where M is a metal, O is oxygen, and z is a number greater than 0 and typically less than 8.

The metal oxide dielectric material has a metal in common with the layer comprising metal carbide, metal boride and/or metal nitride, and such can improve stacking of the dielectric material when the dielectric material is directly against the layer comprising metal carbide, metal boride and/or metal nitride. The layer comprising metal carbide, metal boride and/or metal nitride can be a barrier layer between the metal oxide dielectric material and another material, and/or can be a nucleation layer utilized for growth of the metal oxide dielectric material in a deposition process. Exemplary metals of the metal oxide, metal carbide, metal boride and metal nitride include aluminum, hafnium and lanthanide metals, with the lanthanide metals including lanthanum and the elements of the lanthanide series for purposes of interpreting this disclosure and the claims that follow.

The invention includes methods of forming the layer comprising metal carbide, metal boride and/or metal nitride together with the metal oxide dielectric layer. The invention also includes constructions utilizing the layer comprising metal nitride, metal boride and/or metal carbide in combination with the metal oxide dielectric layer, with exemplary constructions being capacitor constructions.

An exemplary process of the present invention is described with reference to FIG. 1-5. The exemplary process fabricates an exemplary capacitor construction.

Figure 1:
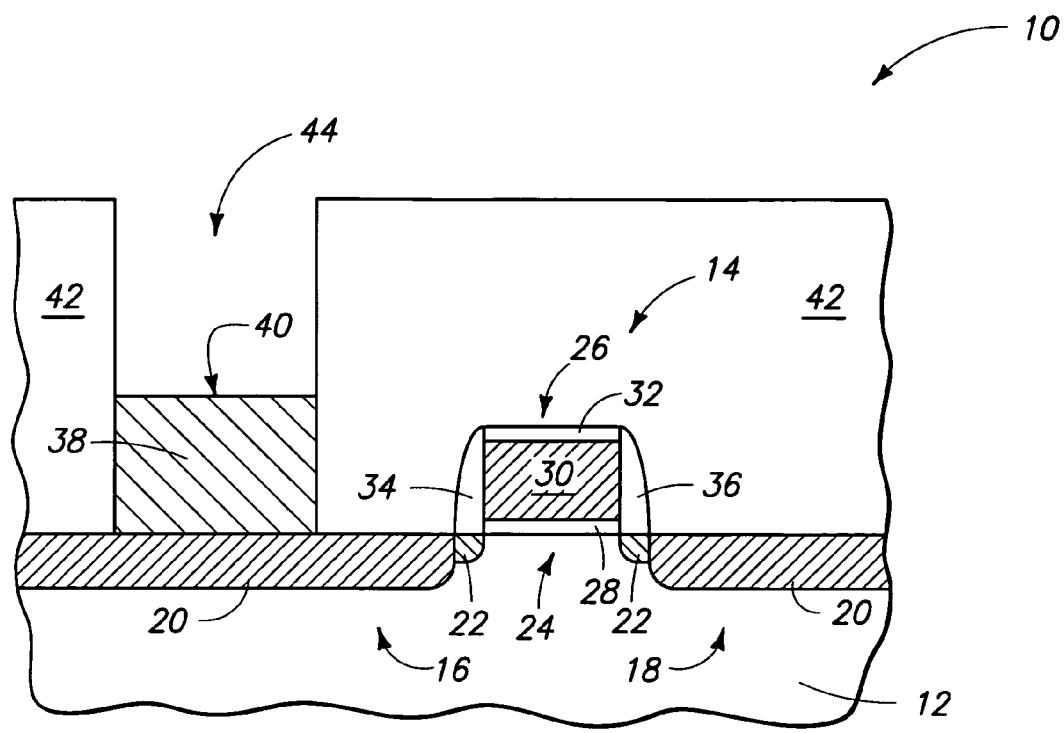
FIG. 1 is a diagrammatic cross-sectional view of a semiconductor wafer fragment at a preliminary processing stage of an exemplary method of the present invention.

Referring to FIG. 1, a semiconductor wafer fragment 10 is illustrated at a preliminary processing stage of the exemplary process of the present invention. Fragment 10 comprises a semiconductor substrate 12. Substrate 12 can comprise, for example, monocrystalline silicon lightly doped with background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A transistor device 14 is shown supported by substrate 12. Device 14 comprises a pair of source/drain regions 16 and 18 extending into substrate 12. The source/drain regions each include a heavily doped region 20 extending relatively deep into substrate 12 and a lightly doped region 22 extending less deep into substrate 12 than the heavily doped region. A channel region 24 is between source/drain regions 16 and 18, and a transistor gate 26 is over the channel region. Transistor gate 26 includes an insulative material 28 (which can be, for example, silicon dioxide, and can be referred to as gate oxide), a conductive material 30 over the insulative material (the conductive material can comprise one or more layers, and in particular aspects will comprise conductively-doped silicon and/or various metals), and an electrically insulative cap 32 over the conductive material (the insulative cap 32 can comprise, for example, silicon nitride and/or silicon dioxide).

A pair of sidewall spacers 34 and 36 extend along sidewalls of gate 26 and over lightly-doped regions 22. Spacers 34 and 36 can comprise any suitable electrically insulative material, including, for example, silicon dioxide and/or silicon nitride. Transistor structure 14 is an exemplary conventional structure, and can be fabricated using conventional methodologies. Other transistor structures can be utilized in place of transistor structure 14.

An electrically conductive pedestal 38 is provided over source/drain region 16. Pedestal 38 can comprise any suitable electrically conductive material, including, for example, conductively-doped silicon and/or various metals. Pedestal 38 has an upper surface 40 which defines an electrical node. It is to be understood that pedestal 38 is optional. If pedestal 38 is eliminated, then the electrical node can be considered to be an upper surface of the diffusion region corresponding to source/drain region 16.

An electrically insulative material 42 is provided over transistor 14, and an opening 44 is formed through insulative material 42 to expose electrical node 40. Insulative material 42 can comprise any suitable material, including, for example, borophosphosilicate glass (BPSG).

Figure 2:
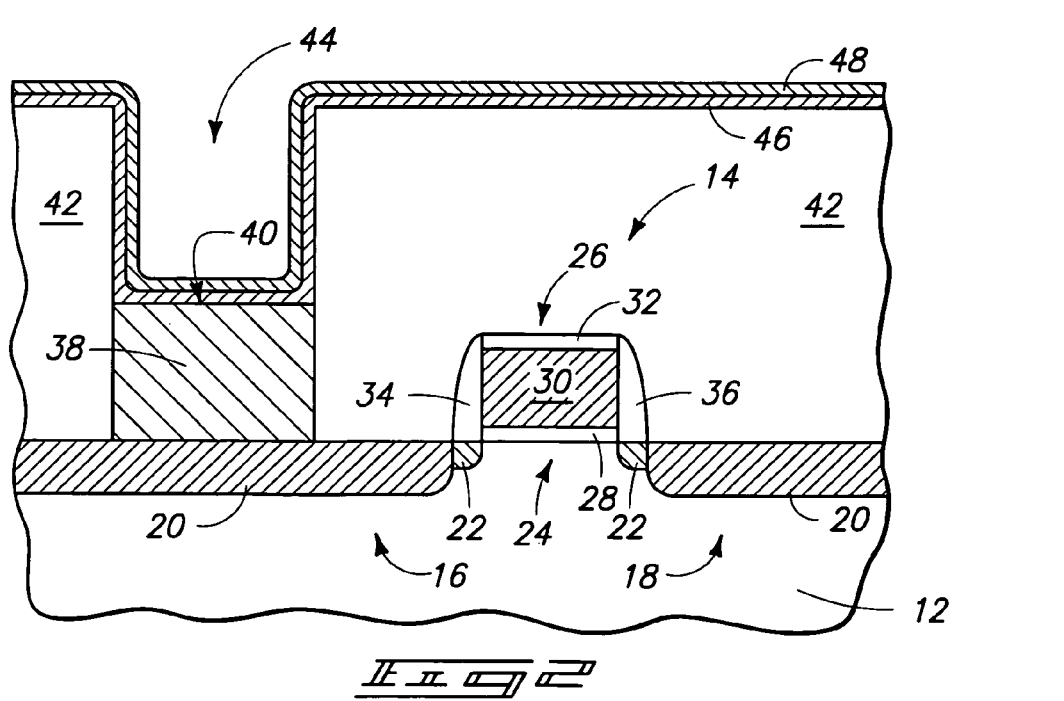
FIG. 2 is a view of the FIG. 1 wafer fragment shown as a processing stage subsequent to that of FIG. 1.

Referring to FIG. 2, an electrically conductive material 46 is provided over an upper surface of insulative material 42 and within opening 44. Electrically conductive material 46 can ultimately be utilized as a capacitor electrode in a capacitor construction formed in accordance with an exemplary aspect of the invention. Conductive material 46 can comprise any suitable electrically conductive material, including, for example, conductively-doped silicon and/or various metals. If material 46 comprises metals, the metals can be utilized either in elemental form, or as conductive compounds. Layer 46 can be referred to as a first electrically conductive material in the discussion that follows, to distinguish layer 46 from conductive materials formed subsequent to layer 46.

Although layer 46 is shown having a smooth outer surface, it is to be understood that layer 46 can also have a roughened (or rugged) outer surface in particular aspects of the invention. For instance, if layer 46 comprises conductively-doped silicon, the outer surface of layer 46 can correspond to hemispherical grain silicon, and accordingly would be a rugged surface.

A barrier layer 48 is formed over conductive material 46. Barrier layer 48 comprises one or more of metal carbide ($MC_x$), metal boride ($MB_q$) and metal nitride ($MN_y$). The metal of barrier layer 48 can comprise a transition metal (such as, for example, hafnium, titanium, tantalum, lanthanides, etc.) or a non-transition metal (such as, for example, aluminum, etc.). Barrier layer 48 is shown to be electrically conductive, but it is to be understood that layer 48 could alternatively be electrically insulative. The conductivity of layer 48 depends on the particular metal composition utilized in the layer, and it is to be understood that some metal carbides and/or metal nitrides suitable for utilization in layer 48 would be electrically insulative rather than electrically conductive. If layer 48 is electrically conductive, layer 46 can be omitted in some aspects of the invention. If layer 46 is omitted, material 48 can physically contact electrical node 40.

Layer 48 is referred to above as a "barrier" as layer 48 is preferably a barrier which prevents reaction between substances associated with a dielectric material (described below) provided on one side of layer 48 with substances from other structures (such as, for example, the shown layer 46) provided on the other side of layer 48. It is to be understood, however, that the invention encompasses aspects in which layer 48 is utilized for other physical characteristics alternatively to, or in addition to, the barrier properties of the layer. For instance, the dielectric material formed over layer 48 typically comprises a metal oxide having a metal in common with the metal nitride, metal boride and/or metal carbide of layer 48. Layer 48 can be utilized for the preferred stacking characteristics of having a metal in common between a metal oxide dielectric material and an underlying metal nitride, metal boride and/or metal carbide material. Layer 48 can be referred to as an intermediate layer in the discussion that follows, rather than as a barrier layer, and in other aspects of the description that follows, layer 48 can be referred to as a diffusion barrier layer.

Layer 48 can have any suitable composition of metal carbide, metal boride and/or metal nitride. In particular aspects, layer 48 will consist essentially of, or consist of metal carbide; in other aspects layer 48 will consist essentially of, or consist of metal boride; and in other aspects, layer 48 will consist essentially of, or consist of metal nitride. In specific applications, layer 48 can comprise, consist essentially of, or consist of hafnium carbide and/or hafnium nitride. In other aspects, layer 48 can comprise, consist essentially of, or consist of aluminum carbide and/or aluminum nitride. In yet other aspects, layer 48 can comprise, consist essentially of, or consist of one or more lanthanide metal carbides and/or one or more lanthanide metal nitrides. It is emphasized, however, that the metal utilized in layer 48 can be any suitable metal, including, for example, hafnium, lanthanide metals or aluminum; but is not limited to the exemplary metals of hafnium, aluminum and lanthanide metals.

Layer 48 can comprise any suitable thickness, and typically would comprise a thickness of from about 5 Å to about 200 Å. Layer 48 can be formed by any suitable method, and typically would be formed utilizing chemical vapor deposition (CVD) and/or atomic layer deposition (ALD).

Although only one layer 48 is shown, it is to be understood that multiple layers comprising metal carbide, metal boride and/or metal nitride could be formed. If multiple layers are formed, the metals within the multiple layers can vary within the stack of multiple layers. In processing described below, a material oxide is formed over the one or more layers comprising metal nitride, metal boride and/or metal carbide. The top layer of a stack of multiple layers of metal nitride, metal boride and/or metal carbide will preferably have a metal in common with the metal oxide contacting such top layer.

Figure 3:
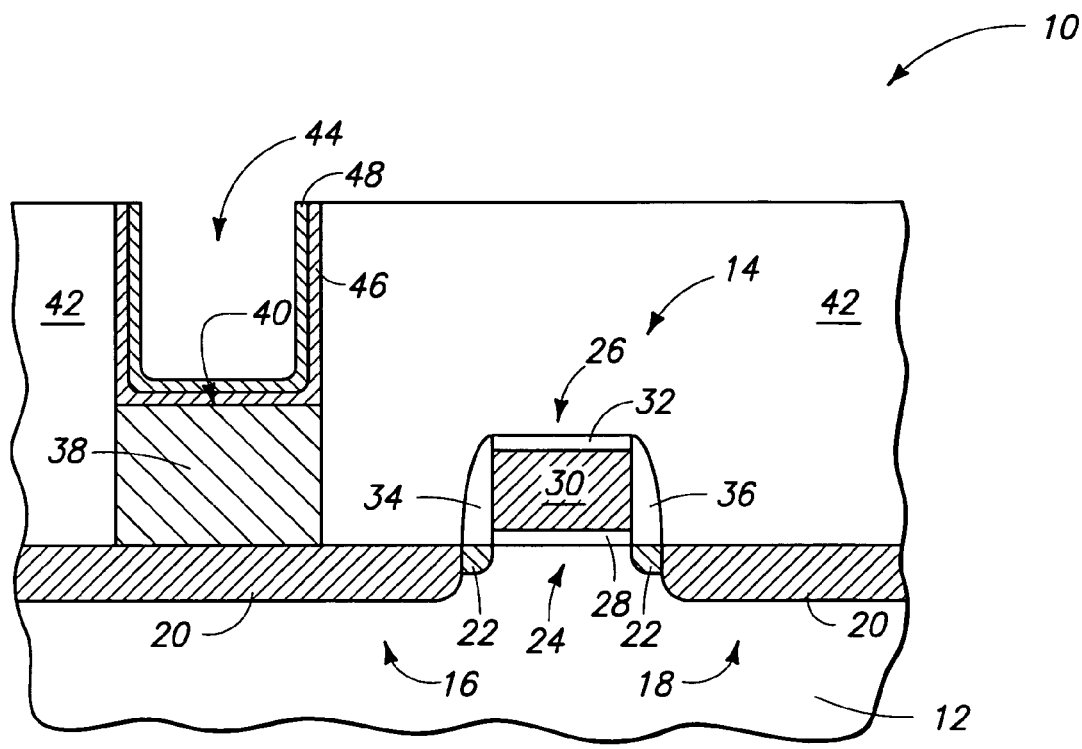
FIG. 3 is a view of the FIG. 1 wafer fragment shown at a processing stage subsequent to that of FIG. 2.

Referring to FIG. 3, layers 46 and 48 are removed from over an upper surface of insulative material 42, while being retained within opening 44. A suitable process for removing layers 46 and 48 from over the upper surface of insulative material 42 can be, for example, chemical-mechanical polishing.

Figure 4:
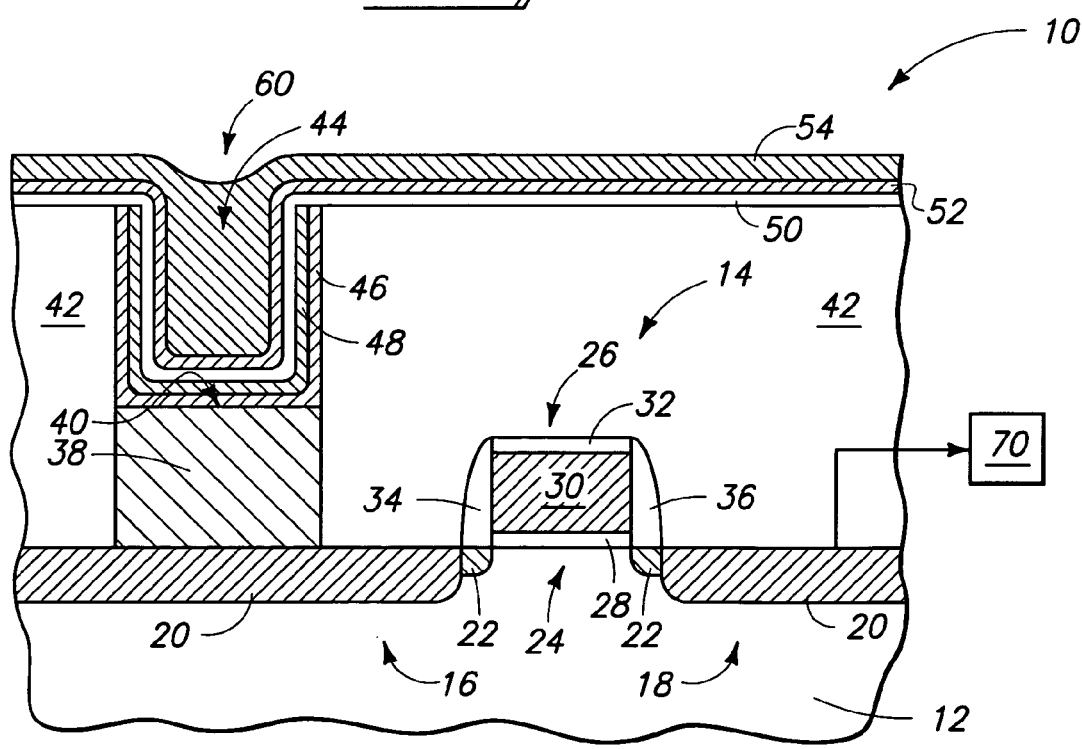
FIG. 4 is a view of the FIG. 1 water fragment shown at a processing stage subsequent to that of FIG. 3.

Referring next to FIG. 4, a layer of dielectric material 50 is deposited over the upper surface of insulative material 42 and over a surface of barrier layer 48 within opening 44. Dielectric material 50 can be formed directly against an upper surface of layer 48, as shown. Layer 50 comprises metal oxide ($MO_z$) and has at least one metal in common with the metal nitride ($MN_y$), metal boride ($MB_q$) and/or metal carbide ($MC_x$) of layer 48. Layer 50 can, for example, consist of a single metal oxide which has a metal in common with metal of layer 48; or comprise multiple metal oxides, of which only a subset has metal in common with one or more metals of layer 48; or can comprise multiple metal oxides of which all have metal in common with metals of layer 48. In particular exemplary aspects, layer 48 can comprise, consist essentially of, or consist of one or both of hafnium nitride and hafnium carbide, and layer 50 can comprise, consist essentially of, or consist of hafnium oxide. In other exemplary aspects, layer 48 can comprise, consist essentially of, or consist of one or more lanthanide metal nitrides and/or one or more lanthanide metal carbides, and layer 50 can comprise, consist essentially of, or consist of one or more lanthanide metal oxides. In other exemplary aspects, layer 48 can comprise, consist essentially of, or consist of aluminum nitride and/or aluminum carbide, and layer 50 can comprise, consist essentially of, or consist of aluminum oxide. In another exemplary aspect, layer 48 can predominantly comprise a composition of a metal and nitrogen, boron or carbon, with the term "predominantly comprise" indicating that more than 50 atomic percent of the layer is the stated composition. In such aspect, dielectric material 50 can predominantly comprise a composition of the metal and oxygen. Dielectric material 50 is typically formed to a thickness of from about 20 Å to about 60 Å.

Although only one layer 50 is shown, it is to be understood that multiple layers comprising metal oxide could be formed. If multiple layers are formed, the metals within the multiple layers can vary within the stack of multiple layers. The bottom layer of a stack of multiple layers of metal oxide (i.e., the layer of the metal oxide stack that is in contact with metal carbide, metal boride and/or metal nitride of layer 48) will preferably have a metal in common with the metal carbide, metal boride and/or metal nitride contacting such bottom layer.

In some aspects of the invention, metal oxide layer 50 can be formed in a common deposition process with the metal nitride, metal boride and/or metal carbide of layer 48. In such aspects, the processing of FIG. 3 is omitted (specifically, layers 46 and 48 are not patterned prior to formation of dielectric material 50). In an exemplary process, layer 48 is formed utilizing one or both of CVD and ALD in reaction chamber, and subsequently dielectric material 50 is deposited utilizing one or both of CVD and ALD in situ in the same reaction chamber utilized for deposition of layer 48. The term "in situ" is utilized to indicate that vacuum to the reaction chamber is not broken between the deposition of layer 48 and the deposition of layer 50.

Since layers 48 and 50 have a metal in common, the deposition of layers 48 and 50 can occur in a continuous and uninterrupted process. Specifically, the deposition of layer 48 can occur by flowing a metal-containing precursor into a reaction chamber in combination with precursors of one or more of carbon, boron and nitrogen. After layer 48 has been formed to a desired thickness, the flow of nitrogen, boron and/or carbon precursor is replaced by a flow of oxygen precursor to initiate formation of layer 50. If the processing utilized for formation of layer 48 is an ALD process, then layer 48 can be formed utilizing a reaction sequence in which metal-containing precursor is flowed into a reaction chamber in an alternating sequence with carbon, boron and/or nitrogen precursors to build up layers of desired metal nitride, metal boride and/or metal carbide materials. After layer 48 is built to a desired thickness, the flow of nitrogen, boron and/or carbon precursor can be replaced with a flow of oxygen precursor. The metal precursor can then be flowed in an alternating sequence with the oxygen precursor to the build up layers of dielectric material 50.

Figure 5:
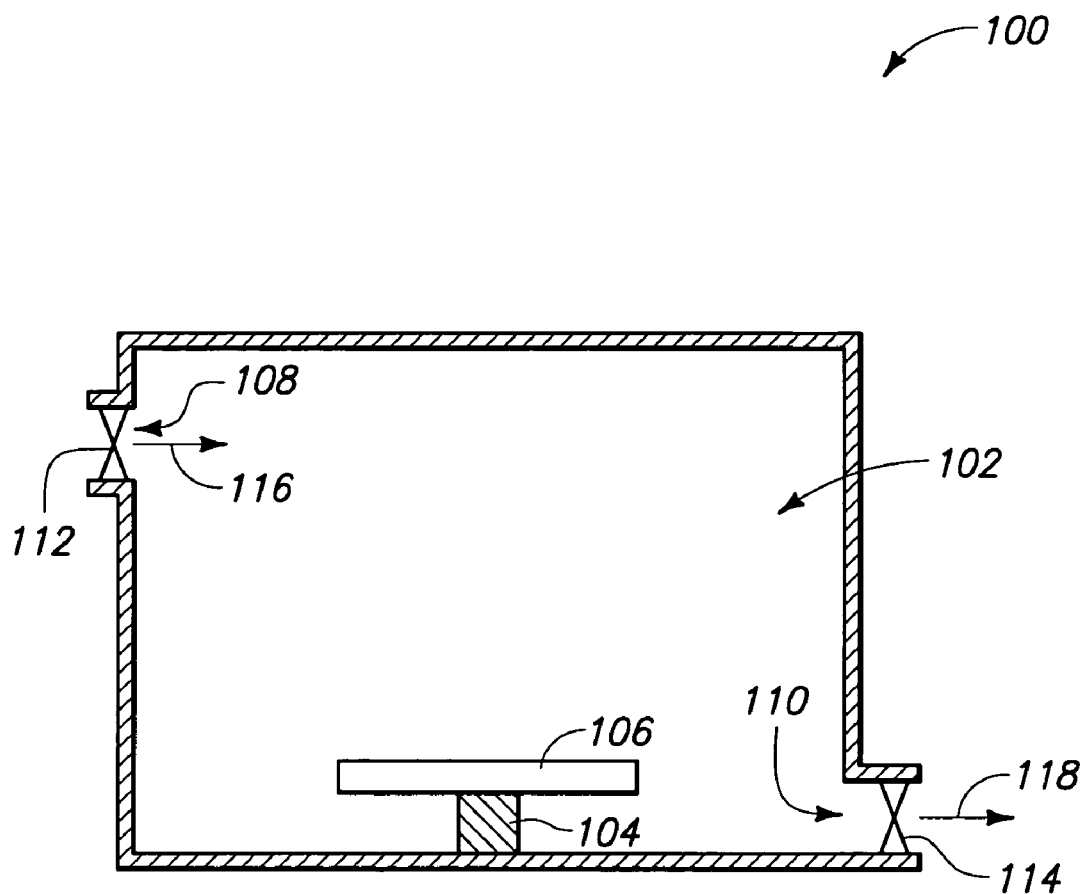
FIG. 5 is a diagrammatic cross-sectional view of an apparatus that can be utilized for conducting a deposition in accordance with various exemplary aspects of the present invention.

An exemplary reaction chamber which can be utilized for chemical vapor deposition and/or atomic layer deposition is described with reference to FIG. 5. Specifically, FIG. 5 shows a cross-sectional view of an apparatus 100 comprising a reaction chamber 102. A wafer holder 104 is provided within the reaction chamber, and is shown supporting a semiconductor wafer substrate 106. Chamber 100 has an inlet 108 extending into reaction chamber 102 and an outlet 110 extending from the reaction chamber. Inlet 108 and outlet 110 are controllably blocked with valves 112 and 114, respectively.

In operation, precursor is flowed into chamber 102 through inlet 108 (as represented by an arrow 116 in the diagram of FIG. 5), and is utilized to form a desired layer (not shown) over exposed surfaces of substrate 106. At appropriate times, reaction by-products and/or unreacted precursor is removed from chamber 102 through outlet 110 (as indicated by arrow 118 in the diagram of FIG. 5). In a CVD process, two or more precursors would be introduced into reaction chamber 102 to react with one another and form a desired layer over substrate 106. In an ALD process, the precursors would be introduced sequentially into reaction chamber 102, and would be provided within the chamber separate from one another. Accordingly, in an ALD process there would be no reaction (or at least no detectable reaction) of precursors with one another in chamber 102, but rather the precursors would be utilized to build up monolayers over a surface of substrate 106.

Referring again to FIG. 4, a second barrier layer 52 is formed over dielectric material 50. Second barrier layer 52 can, like the first barrier layer 48, comprise metal nitride, metal boride and/or metal carbide, and can have a metal in common with dielectric material 50. In particular aspects, second barrier layer 52 comprises an identical composition to first barrier layer 48. Layer 52 can, like layer 48, be referred to as an intermediate layer, rather than as a barrier layer, to emphasize that layer 52 can be utilized for other properties in addition to, or alternatively to, its barrier properties.

Layer 52 is shown as a conductive layer, but it is to be understood that layer 52 can alternatively be electrically insulative depending on the particular composition utilized in layer 52.

Layer 52 can be formed in a CVD and/or ALD process common to that utilized for layer 50. In other words, layer 52 can be formed in the same reaction chamber utilized for deposition of layer 50, and in particular aspects, will be formed in situ relative to layer 50 in a continuous process relative to that utilized for forming layer 50. In some aspects of the invention, layers 48, 50 and 52 can all be formed in a continuous deposition process (such as, for example, a deposition process utilizing CVD and/or ALD). Specifically, all of layers 48, 50 and 52 can be formed in a common reaction chamber without breaking a vacuum to the chamber from the time that deposition of layer 48 is started until the time that deposition of layer 52 is completed.

A second electrically conductive electrode 54 is formed over layer 52. Electrode 54 can comprise, consist essentially of, or consist of conductively-doped silicon and/or various metals and/or metal compositions. In aspects in which layer 52 is electrically conductive, layer 54 can be omitted, and layer 52 can be utilized as the second electrode. However, even when layer 52 is electrically conductive it can be advantageous to form layer 52 relatively thin (such as, for example, to a thickness from about 5 Å to about 200 Å), and to use layer 52 in combination with another conductive material 54 as a capacitor electrode.

Layers 46, 48, 50, 52 and 54 together define a capacitor construction 60. Conductive materials 46 and 48 can be considered to be a first electrode of the capacitor, and conductive materials 52 and 54 can be considered to be a second electrode of the capacitor. The second electrode is capacitively connected to the first electrode, and spaced from the first electrode by dielectric material 50. In constructions in which layers 48 and 52 comprise dielectric materials, the layers 48, 50 and 52 can together be a dielectric material separating a first capacitor electrode defined by layer 46 from a second capacitor electrode defined by layer 54.

Capacitor construction 60 can be incorporated into a DRAM cell. Specifically, the source/drain region 18 can be connected to a bitline 70. Capacitor construction 60 can thus be gatedly connected with bitline 70 through transistor 14.

The present approach can provide numerous advantages. For instance, the present invention can provide the ability to do high temperature oxide depositions (which can give denser, better quality oxide films) since the deposition can start with reducing chemistry that will not oxidize the bottom cell plate (i.e., that will not oxidize electrode 46). After the bottom oxygen barrier (nitride, boride and/or carbide) is deposited (i.e., after deposition of layer 48), the chemistry can be changed to an oxidizing one and the dielectric deposition can be conducted to form material 50. Methodology of the present invention can additionally enable a good lattice match to be obtained between a nitride, boride and/or a carbide layer relative to a metal oxide material. Also, the layer 48 can prevent oxidation of underlying layer 46 which otherwise occur if layer 50 were provided directly against layer 46. Additionally, it is noted that in applications in which aluminum oxide is utilized as the dielectric material, and aluminum carbide and/or nitride is utilized for layers 48 and 52, the layers 48 and 52 will be electrically insulative. The permittivity of layers 48 and 52 will be comparable to that of the aluminum oxide layer 50, which can allow a better quality dielectric material (better permittivity) to be obtained than can be obtained utilizing other insulative nitrides, such as, for example, silicon nitride.

It is noted that the thickness of the nitride, boride and/or carbide layers 48 and 52 can vary according to a desired use, or combination of uses of the layers. For instance, if layers 48 and 52 are utilized as the sole electrodes of a capacitor construction, the layers are preferably formed relatively thick (i.e., have a thickness greater than about 50 Å). In contrast, if the layers are utilized in combination with other conductive materials in capacitor electrodes, the layers can be formed very thin, such as, for example, to a thickness of less than about 10 Å, and even to a thickness of less than about 5 Å.

Devices comprising constructions formed in accordance with methodology of the present invention (such as the above-described DRAM cell) can be utilized in numerous assemblies, including, for example, computer systems and other electronic systems.

Figure 6:
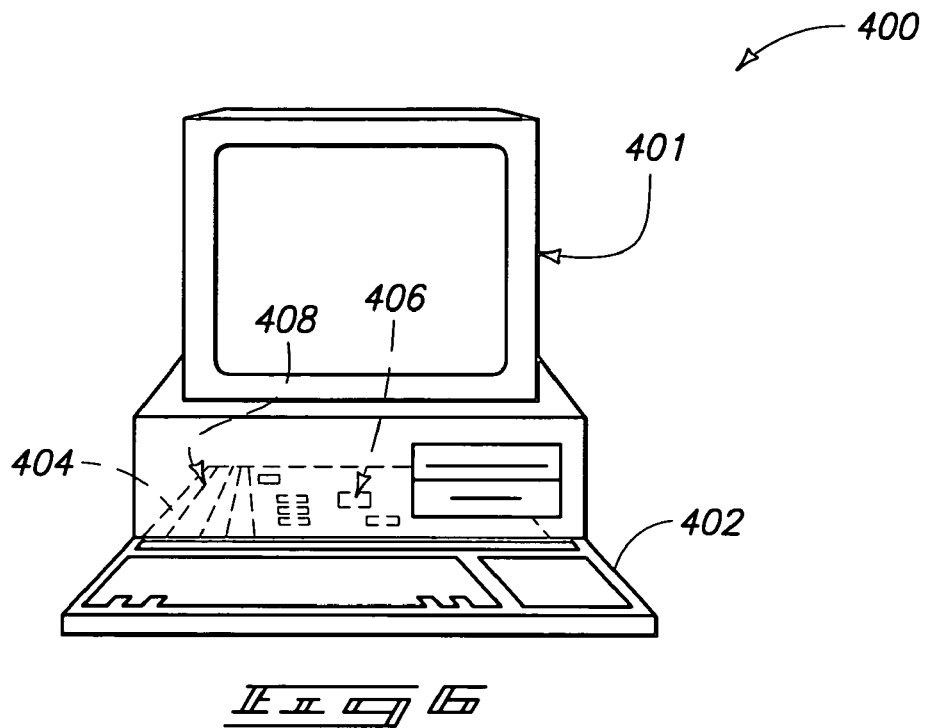
FIG. 6 is a diagrammatic view of a computer illustrating an exemplary application of the present invention.
Figure 7:
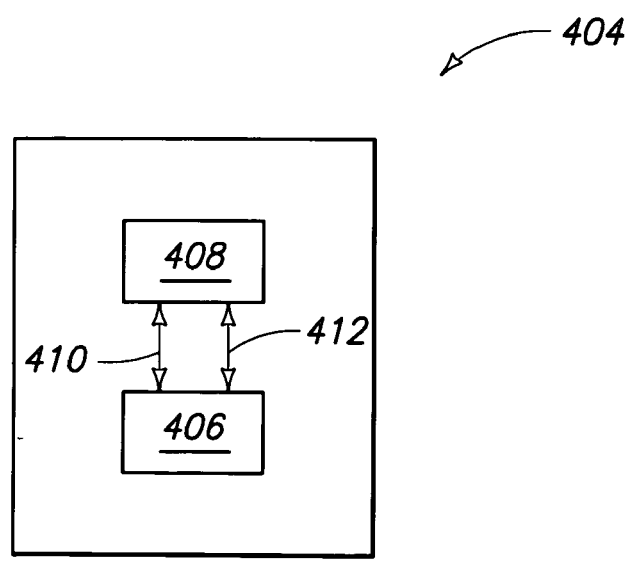
FIG. 7 is a block diagram showing particular features of the motherboard of the FIG. 6 computer.

FIG. 6 illustrates generally, by way of example, but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above, including, for example, the DRAM cell described with reference to FIG. 4. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 7. In such block diagram, the addressing circuitry is illustrated as 410 and the read circuitry is illustrated as 412.

In particular aspects of the invention, memory device 408 can correspond to a memory module. For example, single in-line memory modules (SIMMs) and dual in-line memory modules (DIMMs) may be used in the implementation which utilizes the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Figure 8:
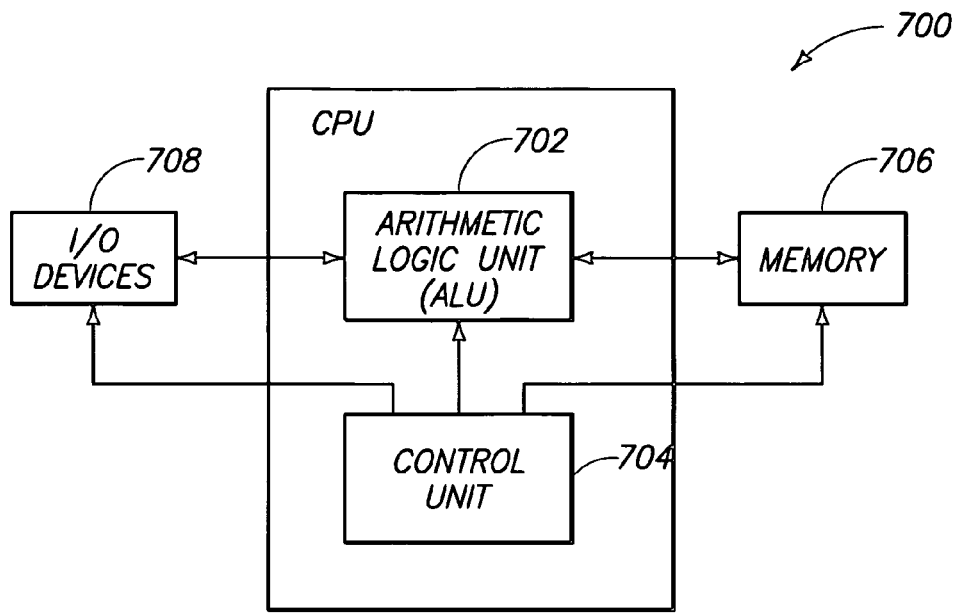
FIG. 8 is a high-level block diagram of an electronic system according to an exemplary aspect of the present invention.

FIG. 8 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include DRAM cells in accordance with various aspects of the present invention.

Figure 9:
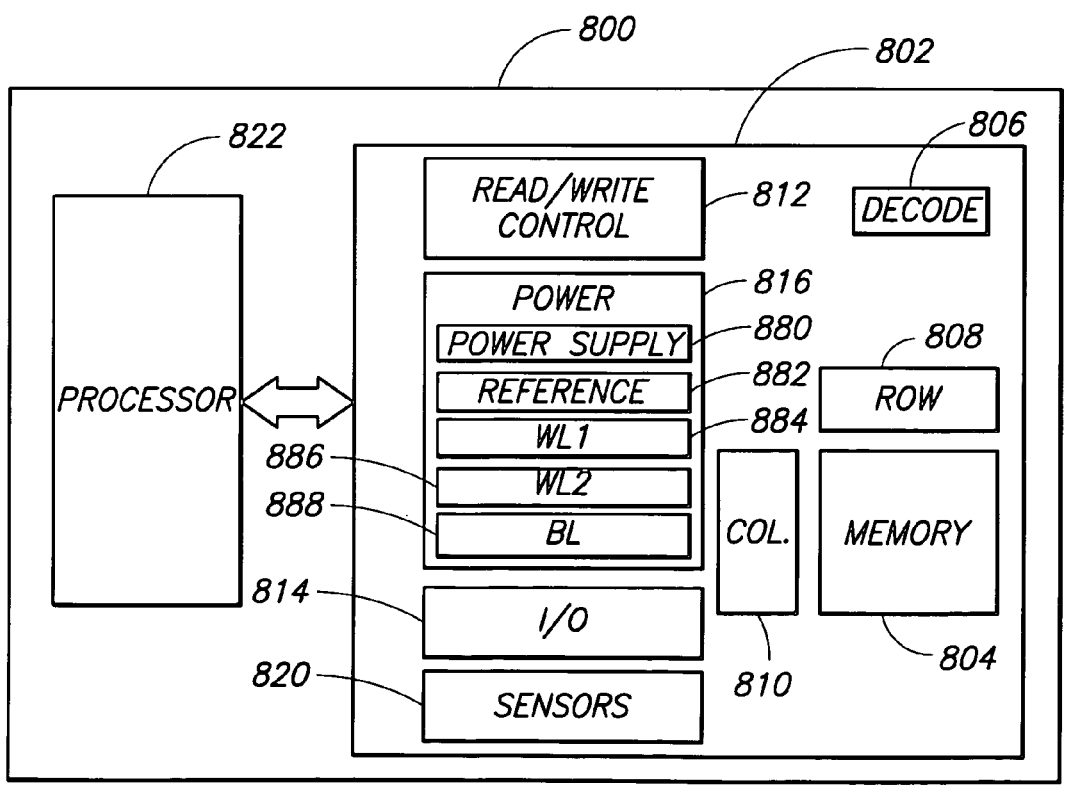
FIG. 9 is a simplified block diagram of an exemplary electronic system according to an aspect of the present invention.

FIG. 9 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822, or memory controller for memory accessing.

The memory device 802 receives control signals 824 from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include a DRAM cell of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of ordinary skill in the art will understand that the various electronic systems can be fabricated in single-package processing units, or even on a single semiconductor chip, in order to reduce the communication time between the processor and the memory device(s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A DRAM construction, comprising:
    a transistor comprising a pair of source/drain regions; and
    a capacitor electrically coupled to one of the source/drain regions; the capacitor including:
        a first electrically conductive material;
        a first intermediate layer over the first electrically conductive material; the first intermediate layer predominantly comprising a composition of aluminum and one or more of nitrogen, boron and carbon;

a dielectric material over and directly against the first intermediate layer, the dielectric material predominantly comprising a composition of aluminum and oxygen;

a second intermediate layer over the dielectric material; the second intermediate layer predominantly comprising the composition of aluminum and one or more of boron, nitrogen and carbon; and a second electrically conductive material over the second intermediate layer; the second electrically conductive material being capacitively connected with the first electrically conductive material.

2. The DRAM construction of claim 1 wherein the second intermediate layer physically contacts the dielectric material.

3. The DRAM construction of claim 1 wherein the second electrically conductive material physically contacts the second intermediate layer.

4. The DRAM construction of claim 1 wherein the first and second intermediate layers consist essentially of aluminum carbide.

5. The DRAM construction of claim 1 wherein the first and second intermediate layers consist essentially of aluminum boride.

6. The DRAM construction of claim 1 wherein the first and second intermediate layers consist essentially of aluminum nitride.

7. An electronic system comprising:

a processor electrically coupled with memory; at least one of the processor and the memory including a capacitor which comprises:

a first electrically conductive material;

a first intermediate layer over the first electrically conductive material; the first intermediate layer predominantly comprising a composition of aluminum and one or more of nitrogen, boron and carbon;

a dielectric material over and directly against the first intermediate layer, the dielectric material predominantly comprising a composition of aluminum and oxygen;

a second intermediate layer over the dielectric material; the second intermediate layer predominantly comprising the composition of aluminum and one or more of boron, nitrogen and carbon; and a second electrically conductive material over the second intermediate layer; the second electrically conductive material being capacitively connected with the first electrically conductive material.

8. The electronic system of claim 7 wherein the second intermediate layer physically contacts the dielectric material.

9. The electronic system of claim 7 wherein the second electrically conductive material physically contacts the second intermediate layer.

10. The electronic system of claim 7 wherein the first and second intermediate layers consist essentially of aluminum carbide.

11. The electronic system of claim 7 wherein the first and second intermediate layers consist essentially of aluminum boride.

12. The electronic system of claim 7 wherein the first and second intermediate layers consist essentially of aluminum nitride.

* * * * *